United States Patent
Goulet et al.

(10) Patent No.: US 7,270,447 B2
(45) Date of Patent: Sep. 18, 2007

(54) UNIFORM LUMINANCE AND COLOR MIXING LENS FOR LED DEVICE

(75) Inventors: René Goulet, Ancienne-Lorette (CA); Guy Drouin, Quebec City (CA); Martin Beaumont, Sainte-Foy (CA)

(73) Assignee: GE Security, Bradenton, FL (US)

( * ) Notice: Subject to any disclaimer, the term of this patent is extended or adjusted under 35 U.S.C. 154(b) by 121 days.

(21) Appl. No.: 11/134,343

(22) Filed: May 23, 2005

(65) Prior Publication Data

US 2006/0262539 A1 Nov. 23, 2006

(51) Int. Cl.
*F21V 5/00* (2006.01)

(52) U.S. Cl. ............ 362/327; 362/800; 362/335; 362/317; 362/355; 359/727; 359/728

(58) Field of Classification Search ........... 362/327, 362/800; 359/727, 728
See application file for complete search history.

(56) References Cited

U.S. PATENT DOCUMENTS

| | | | |
|---|---|---|---|
| 3,663,096 A | * 5/1972 | Fuller | 359/711 |
| 3,759,153 A | * 9/1973 | Aimo et al. | 396/268 |
| 6,836,699 B2 | * 12/2004 | Lukis et al. | 700/200 |
| 2002/0080615 A1 | * 6/2002 | Marshall et al. | 362/333 |

* cited by examiner

*Primary Examiner*—Renee Luebke
*Assistant Examiner*—Jessica L McMillan
(74) *Attorney, Agent, or Firm*—Baker & Hostetler LLP

(57) ABSTRACT

A lens for an LED having a lens body providing total internal reflection of light emitted by the LED from a first emission point disposed proximate a first junction of the lens body and centerplane. The lens includes an arcuate light-diffusing edge for diffusing light emitted by the LED and reflected by the angular base and sidewall assembly, the light being diffused by the lens at substantially uniform luminance across a sector of at least 150 degrees centered and measured about the first junction. The light diffused by the lens provides for substantially uniform mixing of at least two different colors of light emitted by a multi-color LED apparatus disposed at the first emission point.

21 Claims, 3 Drawing Sheets

UNIFORM LUMINANCE AND COLOR MIXING LENS FOR LED DEVICE

CROSS-REFERENCE TO RELATED APPLICATIONS

None

FIELD OF THE INVENTION

The present invention relates generally to electronics and semiconductor devices. More particularly, the present invention relates to multi-color light-emitting diodes and a method and apparatus for focusing and directing light emitted by said diodes.

BACKGROUND OF THE INVENTION

A light emitting diode, or "LED," is well-known in the field of electronics. LEDs are found in all kinds of devices. Among other things, they form the numbers on digital clocks, transmit information from remote controls, light up watches and indicate when an appliance is activated. Alternatively, they can form images on a television screen or illuminate a traffic light. Basically, LEDs function like tiny light bulbs that fit easily into an electrical circuit. Unlike ordinary incandescent bulbs, they do not have a filament but are illuminated solely by the movement of electrons in a semiconductor material.

While all LEDs release light, most do not do it very effectively. In an ordinary diode, the semiconductor material itself ends up absorbing a lot of the light energy. LEDs are specially constructed to release a large number of photons outward. Additionally, they are commonly housed in a plastic bulb or lens that concentrates and directs the light in a particular direction. The main advantage of an LED is energy efficiency. LEDs generate very little heat, relatively to a conventional light bulb. A much higher percentage of the electrical power supplied is directly converted to light. Yet the advantages of this energy efficiency are lost if the light generated is not properly focused and directed in the directions desired.

Many of the lens devices fitted for use with an LED are not capable of directing light in a uniform manner across a range of viewing angles. It is often necessary, especially with electronics and devices using electronics, such as circuit boards, to have light emitting devices be viewable from a range of angles. Most light focusing devices and lenses used with LEDs do not create a source of light that is viewable at constant intensity across the entire range of possible viewing angles. The light emitted is not omnidirectional but has varying intensity or luminance from different viewing angles, such as the top versus the side. Accordingly, it is desirable to provide a method and apparatus that provides for uniform luminance emitted by an LED when viewed from any viewing angle.

Furthermore, many devices employ multi-color LEDs, or clusters of monochromatic LEDs having varying colors, to be able to generate any color within the visible light spectrum. The shape of the LED lens generally does not provide for uniform mixing of the various colors of light emitted by the LED. Nor is the color uniform when viewed from different viewing angles about the LED lens. Therefore, it is desirable to provide a method and apparatus that provides for uniform color mixing and chromaticity for light emitted by an LED when viewed from any viewing angle around the LED.

SUMMARY OF THE INVENTION

The foregoing needs are met, to a great extent, by the present invention, wherein in one aspect a method and apparatus is provided that in some embodiments provides for uniform luminance emitted by an LED when viewed from any viewing angle. The needs are further met, by the present invention, wherein in one aspect an apparatus is provided that in some embodiments provides a method and apparatus that provides for uniform color mixing and chromaticity for light emitted by an LED when viewed from any viewing angle around the LED.

In accordance with one embodiment of the present invention, a lens for an LED is provided, having a lens body having a centerplane dividing the lens body into symmetric halves. Each half of the lens body has an angular base. The angular base includes a first reflection surface extending substantially perpendicular from the centerplane at a first junction of the lens body and centerplane. The first junction is substantially proximate a first emission point of the LED. A second reflection surface extends from a distal end of said first reflection surface at an angle having a range of 130 to 150 degrees measured from a line connecting the distal end and first junction, wherein a plane extending along the second reflection surface intersects a distal edge of the half at an intersection point, the intersection point being at an angle having a range of 64 to 74 degrees from the centerplane, measured about the first junction.

Each half of the lens body further includes an arcuate light-diffusing surface having proximal and distal portions. The arcuate light-diffusing surface extends from the intersection point to a second junction of the centerplane and lens body. The lens body has a height defined by the distance between the first and second junctions. The proximal portion has a radius of curvature having a range of 1.75 to 2.15 times the height, while the distal portion has a radius of curvature having a range of 0.25 to 0.32 times the height. The proximal portion of the light-diffusing surface traces an angle having a range of 20 to 24 degrees about a center of curvature for the proximal portion, and the distal portion of the light-diffusing surface traces an angle in having a range of 50 to 54 degrees about a center of curvature for the distal portion.

In accordance with another aspect of the present invention, a lens is provided for an LED. The lens includes a lens body having a centerplane. The lens body further includes an angular base and sidewall assembly for total internal reflection of light emitted by the LED from a first emission point disposed proximate a first junction of the lens body and centerplane. The lens body also includes an arcuate light-diffusing surface for diffusing light emitted by the LED and reflected by the angular base and sidewalls assembly. The light is diffused by the lens at substantially uniform luminance across a sector of at least 150 degrees centered and measured about the first junction. Furthermore, the light diffused by the lens provides for substantially uniform mixing of at least two different colors of light emitted by a multi-color LED apparatus disposed at the first emission point.

In accordance with yet another embodiment aspect of the present invention, a method of focusing and directing light emitted by an LED is provided. Light emitted from a first emission point of the LED is refracted and reflected through a lens body having a centerplane dividing the lens body into symmetric halves. Each half of the lens body includes an angular base having a first reflection surface extending substantially perpendicular from the centerplane at a first junction of the lens body and centerplane, the first junction being substantially proximate the first emission point of the LED. A second reflection surface extends from a distal end of said first reflection surface at an angle having a range of 130 to 150 degrees measured from a line connecting the distal end and first junction, wherein a plane extending along the second reflection surface intersects a distal edge of the half at an intersection point, the intersection point being at an angle having a range of 64 to 74 degrees from the centerplane, measured about the first junction.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

Figure 1:
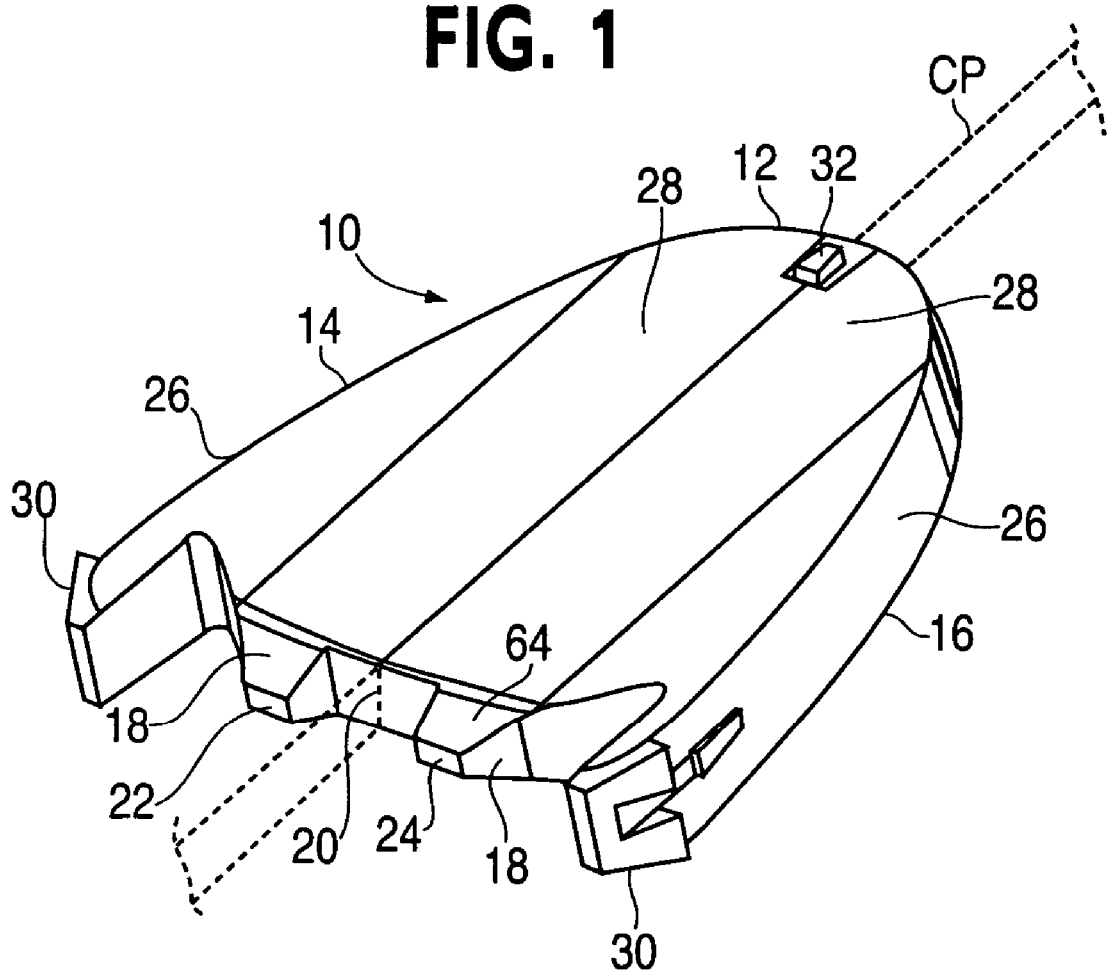
FIG. 1 is a perspective view illustrating a lens according to one embodiment of the invention.

The invention will now be described with reference to the drawing figures, in which like reference numerals refer to like parts throughout. As used herein, the term "junction" shall refer to the point, segment or arc where a line or plane first intersects a body, taken from a direction heading towards the body from outside the body. Also as used herein, a "frustum" shall mean a part of a solid, such as a cone or pyramid, between two parallel planes cutting the solid, between the base and a plane parallel to the base. It may be a truncated cone or pyramid; the part that is left when a cone or pyramid is cut by a plane parallel to the base and the apical part is removed. Also as used herein, an "apical plane" shall be the plane defining the top of a frustum, proximate the would-be apex of the cone or pyramid transformed into a frustum. Furthermore, as used herein, a "centerplane" shall mean a planar analog of a centerline, defining a plane on both sides of which a symmetric body or solid or arrangement of elements is disposed.

An embodiment in accordance with the present invention provides a lens for focusing and directing light emitted by a light emitting diode, such that the light is viewable from a range of viewing angles at uniform luminance, intensity and chromaticity. An embodiment of the present inventive apparatus is illustrated in FIG. 1. FIG. 1 is a perspective view illustrating a lens 10 having a solid lens body 12 divided by a centerplane CP into symmetric halves 14 and 16. Each half includes an angular base 18 which spans across the bottom of the respective halves 14 and 16 of the lens body 12.

The lens is adapted to be flush mounted against an LED at a number of points. As used herein, an "emission point" for an LED shall mean a point where an LED is positioned and emits light, and consequently the point where light is received by the lens 10 of the present invention. A first emission point 20 is located directly on the centerplane as shown in FIG. 1, or substantially proximate to that point, between the two angular bases 18 of each half 14 and 16 of the lens body 12. The first emission point 20 approximates the point against which the LED is positioned when the lens 10 is mounted over it. A second 22 and third 24 emission point is also provided on the angular bases 18 for alternative LEDs to be used with the lens 10. Any gap which may exist between the lens 12 and the LEDs at the various emission points may be filled with RTD or some silicone gel material.

Light emitted from any of these emission points is reflected and refracted by the lens body 12 and directed out of the lens 10 to be viewed. Each half of the lens body 12 includes an arcuate light-diffusing surface 26 through which the reflected and refracted light is diffused or transmitted out from the lens body 12. Each half 14 and 16 of the lens body 12 further includes a pair of light-opaque side-walls 28 which are substantially parallel to each other and which extend from opposite edges of the centerplane CP where it intersects the lens body 12, out to the angular base 18 and arcuate surface 26. Light received by the lens body 12 at any of the LED emission points 20, 22, and 24 is internally reflected within the lens body 12 by the angular base 18 and light-opaque side-walls 28. This provides for total internal reflection of light within the lens body 12. This also directs light to be transmitted or diffused by the lens body primarily through the arcuate light-diffusing surfaces 26 at the distal edge of each half 14 and 16 of the lens body 12.

As used herein, the term "light-opaque" shall mean a property wherein light is more likely to be internally reflected rather than transmitted or diffused. Also as used herein, the term "light-diffusing" shall mean a property wherein light is more likely to be diffused and transmitted than internally reflected. Finally, as used herein, the term "distal" shall mean of or relating to a distance away, or furthest, from the centerplane CP or emission points 20, 22, and 24, according to the relevant context. Consequently, the term "proximal" shall have the opposite meaning to the term "distal", and shall mean of or relating to a distance near, or closest, to the centerplane CP or emission points 20, 22, and 24, according to the relevant context.

The embodiment of the lens 10 shown in FIG. 1 also includes a pair of clips 30 and a notch 32 formed on the lens body 12 as shown, for use with attaching the lens 10 to a device, such as a circuit board.

Figure 2:
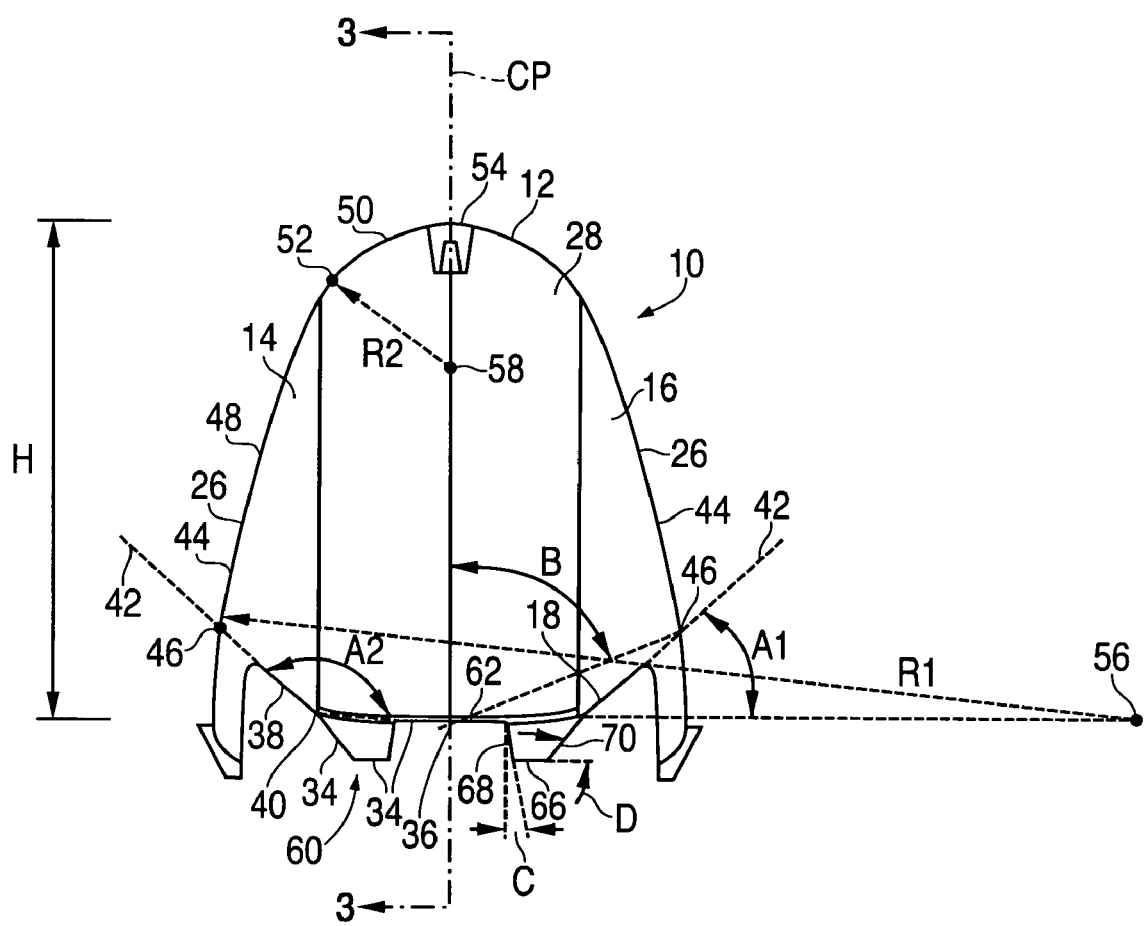
FIG. 2 is a top view of a the lens shown in FIG. 1.

FIG. 2 is a top view of a the lens shown in FIG. 1. It shows some of the dimensions of the lens 10 in more detail. The angular base 18 includes a first reflection surface 34 extending substantially perpendicular from the centerplane CP at a first junction 36 of the lens body 12 and centerplane CP. The first junction 36 coincides or is proximate to the first emission point 20 shown in FIG. 1. As used herein, a "reflection surface" shall mean any complex surface which acts to reflect light, and, in the case of the present invention, serves as an exterior surface of a solid lens body, and acts to provide partial or total internal reflection of light propagating through the lens body. As can be seen in FIG. 2, the first reflection surface 34 has many planar subsurfaces at various angles to each other, and which, taken together, forms the first reflection surface 34 which extends distally from the centerplane CP. A second reflection surface 38 extends from the distal end 40 of the first reflection surface 34. A plane 42 which extends along the second reflection surface 38 intersects the distal edge 44 of each half 14 and 16 at an intersection point or segment 46. The distal edge in this case is the arcuate light-diffusing surface 26.

The second reflection surface 38 is oriented at an angle A1 at shown, measured from a line normal to the centerplane extending from the first junction 36. Angle A1 is in the range of 30 to 50 degrees. Accordingly the angle A2 the second reflection 38 surface makes inside the lens body 12 is the complement of angle A1, and is in the range of 130 to 150 degrees. The line 42 through intersection point 46 forms an angle B as shown, measured from the centerplane CP about the first junction 36, and is in the range of 64 to 74 degrees. This angle also coincides substantially with the maximum emission angle of light emitted by an LED at the first emission point at first junction 36.

Each of the arcuate light-diffusing surfaces 26 includes a proximal portion 48 and a distal portion 50. The proximal portion 48 is located between the first intersection point 46 and a section point 52 where the radius of curvature of the arcuate light-diffusing surface 26 changes. The proximal portion 48 has a first radius of curvature R1 as shown. The distal portion 50 has a second radius of curvature R2 as shown. The lens body 12 is defined by a height dimension H as shown, defined by the distance along the centerplane CP which lies between the first junction 36 and a second junction 54 of the lens body 12 and centerplane CP. The first radius of curvature R1 is in the range of 1.75 to 2.15 times the height H. The second radius of curvature R2 is in the range of 0.25 to 0.32 times the height H. The angle which the proximal portion 48 of the arcuate light-diffusing surfaces 26 traces is in the range of 20 to 24 degrees about a first center of curvature 56, while the angle which the distal portion 50 of the arcuate light-diffusing surfaces 26 traces is in the range of 50 to 54 degrees about a second center of curvature 58.

It can be seen that a portion of the first reflection surface 34 forms a frustum 60 of a skewed pyramidal shape extending from a first plane 62 of the first reflection surface 34. The first plane 62 is perpendicular to the centerplane CP at the first junction 36, and forms the most proximal portion of the angular base 18. At the distal end of the first plane 62, the angular base 18 extends as the rest of the first reflection surface 34 and is shaped as frustum 60 which is facing outwards with respect to the lens body 12. Frustum 60 includes congruent side planes 64 (shown more clearly in FIG. 1), which extend from the sidewalls 28 to an apical plane 66. A proximal side plane 68 extends from the distal end of the first plane 62 between the two side planes 64 to the apical plane 66 and is oriented at an angle C in the range of 0 to 10 degrees, or 90 to 100 degrees measured from the first plane 62 about its distal end. A distal side plane 70 extends from the distal end of the apical plane 66 to the proximal end of the second reflection surface 38, and defines an angle D in the range of 47 to 58 degrees measured from a line extending distally from the apical plane 66 about the distal end of the apical plane 66. It is understood that the apical planes 66 on each of the halves 14 and 16 of the lens body 12 coincide with the second and third emission points 22 and 24 (shown in FIG. 1) for an LED to be used with the lens 10.

Figure 3:
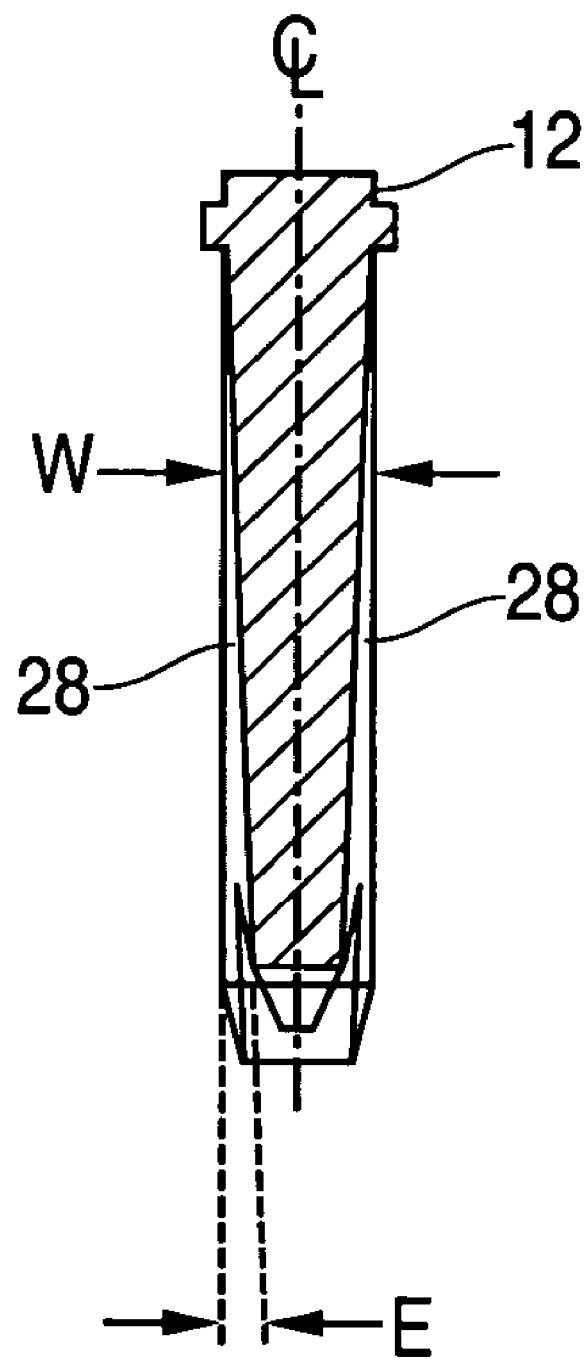
FIG. 3 is a cross-sectional view taken along the line 3-3 in FIG. 2.

FIG. 3 is a cross-sectional view taken along the line 3-3 in FIG. 2 and shows the width W of the lens body 12 which has a centerline CL as shown. The width W approximates the spacing of the sidewalls 28, which are slanted to slope away from each other as they extend distally from the centerplane. This is shown by angle E which ranges from 0 to 5 degrees.

The lens body 12 may be made from a number of materials, of which one embodiment of the present invention uses acrylic. A number of special textures is applied to the surfaces of the lens body 12 to give them a more light-opaque or light-diffusing quality. The angular base 18 and sidewalls 28 may have a very glossy surface texture, such as SPI-A2, as defined by the Society of the Plastics Inudstry. The arcuate light-diffusing surfaces 26 may have a very diffusive texture such as VDI-42, as defined by the Society of German Engineers (Verein Deutscher Ingenieure).

The lens body 12 therefore is shaped as described to direct and focus light emitted by an LED which may be placed at any of the emission points set forth herein. Because of the particular shape of the lens body 12, light is almost entirely directed, through internal reflection and refraction at the surface, to be diffused through the arcuate light-diffusing surfaces 26 only. Furthermore, because of the shape, the light is diffused and transmitted from the lens body 12 at substantially uniform luminance across a viewing angle range defined by a sector centered at the centerline CL and perpendicular to the centerplane CP, having a width of at least 150 degrees, and up to 180 degrees. In addition to luminance, the shape of lens 10 allows for substantially uniform mixing of at least two different colors of light emitted by a multi-color LED disposed at the first emission point.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A lens for an LED, comprising:
a lens body having a centerplane dividing the lens body into symmetric halves, each half having an angular base having
a first reflection surface extending substantially perpendicular from the centerplane at a first junction of the lens body and centerplane, the first junction being substantially proximate a first emission point of the LED, and
a second reflection surface extending from a distal end of said first reflection surface at an angle having a range of 130 to 150 degrees measured from a line connecting the distal end and first junction, wherein a plane extending along the second reflection surface intersects a distal edge of the half at an intersection point, the intersection point being at an angle having a range of 64 to 74 degrees from the centerplane, measured about the first junction, wherein light diffused by the lens provides for substantially uniform mixing of at least two different colors of light emitted by a multi-color LED apparatus disposed at the first emission point.

2. The lens of claim 1, wherein each half of the lens body further comprises: an arcuate light-diffusing surface having proximal and distal portions and extending from the intersection point to a second junction of the centerplane and lens body, the lens body having a height defined by the distance between the first and second junctions, the proximal portion having a radius of curvature having a range of 1.75 to 2.15 times the height, the distal portion having a radius of curvature having a range of 0.25 to 0.32 times the height.

3. The lens of claim 2, wherein the proximal portion of the light-diffusing surface traces an angle having a range of 20 to 24 degrees about a center of curvature for the proximal portion, and the distal portion of the light-diffusing surface traces an angle in having a range of 50 to 54 degrees about a center of curvature for the distal portion.

4. The lens of claim 3, wherein the arcuate light-diffusing surface has a surface texture of VDI-42.

5. The lens of claim 2, wherein each half of the lens body further comprises:
   first and second light-opaque sidewalls substantially parallel to each other, the sidewalls extending substantially perpendicular from opposite edges of the centerplane between the first and second junctions and extending to the angular base and arcuate light-diffusing surface.

6. The lens of claim 5, wherein the first reflection surface defines a first plane extending from the first junction perpendicular to the centerplane and defines a frustum of a skewed pyramid extending from a distal end of the first plane, the frustum extending outwards with respect to the lens body and having
   congruent side planes extending from the first and second sidewalls to an apical plane of the frustum,
   a proximal side plane extending from the distal end of the first plane between the congruent side planes to a proximal end of the apical plane, and
   a distal side plane extending from a distal end of the apical plane to a proximal end of the second reflection surface.

7. The lens of claim 6, wherein the proximal side plane of the frustum defines an angle having a range of 90 to 100 degrees measured from the first plane about the distal end of the first plane.

8. The lens of claim 7, wherein the distal side plane of the frustum defines an angle having a range of 47 to 58 degrees measured from a line extending distally from the apical plane about the distal end of the apical plane.

9. The lens of claim 5, wherein the apical plane is adapted to be disposed against a second emission point for an LED.

10. The lens of claim 5, wherein the sidewalls are spaced apart at a distance having a range of 0.17 to 0.21 times the height.

11. The lens of claim 5, wherein the first and second sidewalls and angular base have a surface texture of SPI-A2.

12. A lens for an LED having a lens body having a centerplane, comprising:
    an angular base and sidewall assembly for total internal reflection of light emitted by the LED from a first emission point disposed proximate a first junction of the lens body and centerplane, and
    an arcuate light-diffusing surface for diffusing light emitted by the LED and reflected by the angular base and sidewall assembly, the light being diffused by the lens at substantially uniform luminance across a sector of at least 150 degrees centered and measured about the first junction, wherein the light diffused by the lens provides for substantially uniform mixing of at least two different colors of light emitted by a multi-color LED apparatus disposed at the first emission point.

13. The lens of claim 12, wherein the angular base and sidewall assembly further comprises:
    a reflection surface for total internal reflection of light from at least two LED elements disposed at opposite sides of the first emission point and offset from the centerplane, defining a second and third emission point for the lens.

14. The lens of claim 13, wherein the at least two LED elements are monochromatic LED elements.

15. The lens of claim 12, wherein the angular base and sidewall assembly have a surface texture of SPI-A2.

16. The lens of claim 12, wherein the arcuate light-diffusing surface has a surface texture of VDI-42.

17. A method of focusing and directing light emitted by an LED, comprising:
    reflecting and refracting light emitted from a first emission point of the LED through a lens body having a centerplane dividing the lens body into symmetric halves, each half having an angular base having
    a first reflection surface extending substantially perpendicular from the centerplane at a first junction of the lens body and centerplane, the first junction being substantially proximate the first emission point of the LED, and
    a second reflection surface extending from a distal end of said first reflection surface at an angle having a range of 130 to 150 degrees measured from a line connecting the distal end and first junction, wherein a plane extending along the second reflection surface intersects a distal edge of the half at an intersection point, the intersection point being at an angle having a range of 64 to 74 degrees from the centerplane, measured about the first junction, wherein the light diffused by the lens provides for substantially uniform mixing of at least two different colors of light emitted by a multi-color LED apparatus disposed at the first emission point.

18. The method of claim 17, further comprising:
    applying a texture of SPI-A2 to the angular base.

19. The method of claim 17, wherein each half of the lens body further comprises an arcuate light-diffusing surface having proximal and distal portions and extending from the intersection point to a second junction of the centerplane and lens body, the lens body having a height defined by the distance between the first and second junctions, the proximal portion having a radius of curvature having a range of 1.75 to 2.15 times the height, the distal portion having a radius of curvature having a range of 0.25 to 0.32 times the height, and further comprising:
    applying a texture of VDI-42 to the light-diffusing arcuate edge.

20. A lens for an LED having a lens body having a centerplane, comprising:
    an angular base and sidewall assembly for total internal reflection of light emitted by the LED from a first emission point disposed proximate a first junction of the lens body and centerplane,
    an arcuate light-diffusing surface for diffusing light emitted by the LED and reflected by the angular base and sidewall assembly, the light being diffused by the lens at substantially uniform luminance across a sector of at least 150 degrees centered and measured about the first junction, and
    a reflection surface for total internal reflection of light from at least two LED elements disposed at opposite sides of the first emission point and offset from the centerplane, defining a second and third emission point for the lens.

21. The lens of claim 20, wherein the at least two LED elements are monochromatic LED elements.

* * * * *